US008897011B2

(12) United States Patent
Kwak et al.

(10) Patent No.: US 8,897,011 B2
(45) Date of Patent: Nov. 25, 2014

(54) HEAT DISSIPATION SYSTEM FOR POWER MODULE

(75) Inventors: Young Hoon Kwak, Gyunggi-do (KR); Jong Man Kim, Gyunggi-do (KR); Young Ho Sohn, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 279 days.

(21) Appl. No.: 13/588,734

(22) Filed: Aug. 17, 2012

(65) Prior Publication Data

US 2013/0343001 A1    Dec. 26, 2013

(30) Foreign Application Priority Data

Jun. 22, 2012  (KR) .................. 10-2012-0067386

(51) Int. Cl.
  *H05K 7/20*      (2006.01)
(52) U.S. Cl.
  USPC ........... 361/699; 361/689; 361/702; 361/703; 361/707; 361/709; 165/80.4
(58) Field of Classification Search
  None
  See application file for complete search history.

(56) References Cited

U.S. PATENT DOCUMENTS

| 6,991,024 | B2 * | 1/2006 | Goodson et al. ............. 165/80.4 |
| 7,114,550 | B2 * | 10/2006 | Nakahama et al. .......... 165/80.4 |
| 7,173,823 | B1 * | 2/2007 | Rinehart et al. .............. 361/699 |
| 7,697,292 | B2 * | 4/2010 | Uluc et al. .................... 361/699 |
| 7,760,503 | B2 * | 7/2010 | Aoki et al. .................... 361/699 |
| 7,948,758 | B2 * | 5/2011 | Buhler et al. ................. 361/702 |
| 8,064,234 | B2 * | 11/2011 | Tokuyama et al. ........... 363/141 |
| 8,081,465 | B2 * | 12/2011 | Nishiura ....................... 361/703 |
| 8,391,011 | B2 * | 3/2013 | Mori et al. .................... 361/717 |
| 2011/0017496 | A1 | 1/2011 | Hayashi et al. |

* cited by examiner

*Primary Examiner* — Boris Chervinsky
(74) *Attorney, Agent, or Firm* — Ladas & Parry, LLP

(57) ABSTRACT

Disclosed herein is a heat dissipation system for a power module, the heat dissipation system including: first and second heat dissipation plates spaced apart from each other while facing each other, to form a cooling medium flow passage; first and second inflow lines extended to the cooling medium flow passage of the first and second heat dissipation plates, to transfer cooling media flowing therein at different flow rates or different fluxes to the cooling medium flow passage; and first and second inlets respectively connected with the first and second inflow lines to allow the cooling media to flow therein.

18 Claims, 5 Drawing Sheets

HEAT DISSIPATION SYSTEM FOR POWER MODULE

CROSS REFERENCE TO RELATED APPLICATION

This application claims the benefit of Korean Patent Application No. 10-2012-0067386, filed on Jun. 22, 2012, entitled "Heat Dissipation System for Power Module", which is hereby incorporated by reference in its entirety into this application.

BACKGROUND OF THE INVENTION

1. Technical Field

The present invention relates to a heat dissipation system for a power module.

2. Description of the Related Art

A power semiconductor device is applied to all home appliances and industries, and the use range thereof is an expanding trend. Since the power semiconductor device minimizes the power consumption and energy, the importance thereof is more emphasized in response to the emergence of ecofriendly issues.

Currently, in a heat dissipation system for a power module, a power device generating a large amount of heat, such as, an insulated gate bipolar mode transistor (IGBT), a fast recovery diode (FRD), or the like, is bonded onto a heat dissipation substrate by using a solder, a thermal interface material (TIM), a thermal conductive grease, or the like.

Therefore, the heat generated from the power device is dissipated through a heat dissipation system attached on a bottom surface of the power device.

The above-described heat dissipation system employs an air cooling method or a water cooling method, using an aluminum heat sink, a heat spreader, or a heat pipe, as shown in Patent Document 1.

RELATED ART DOCUMENTS

Patent Document (Patent Document 1) US 2011-0017496 A

SUMMARY OF THE INVENTION

The present invention has been made in an effort to provide a heat dissipation system for a power module, capable of improving heat dissipation efficiency by including a plurality of inflow lines and allowing cooling media to flow through the inflow lines at different flow rates.

According to a preferred embodiment of the present invention, there is provided a heat dissipation system for a power module, the heat dissipation system including: first and second heat dissipation plates spaced apart from each other while facing each other, to form a cooling medium flow passage; first and second inflow lines extended to the cooling medium flow passage of the first and second heat dissipation plates, to transfer cooling media flowing therein at different flow rates or different fluxes to the cooling medium flow passage; and first and second inlets respectively connected with the first and second inflow lines to allow the cooling media to flow therein.

The first and second inflow lines may be extended to one side of the first and second heat dissipation plates.

Here, when the first and second heat dissipation plates and the first and second inflow lines are plural in number, the plurality of first and second heat dissipation plates and the first and second inflow lines may be combined with each other in a stacking type.

The plurality of first and second inflow lines may be all connected to the first and second inlets, respectively, while the first and second inflow lines are separated from each other.

The heat dissipation system may further include a plurality of heat dissipation fins formed on a cooling medium flow passage formation plane of the first and second heat dissipation plates.

The heat dissipation system may further include a partition member formed between the plurality of heat dissipation fins on the cooling medium flow passage formation plane of the first and second heat dissipation plates.

The heat dissipation system may further include a controller controlling fluxes or flow rates of the cooling media flowing into the first and second inlets.

The controller may control the fluxes or flow rates of the cooling media flowing into the first and second inlets to be different from each other.

The heat dissipation system may further include an insulating layer formed on the first and second heat dissipation plates.

The heat dissipation system may further include semiconductor devices formed on the insulating layer.

The heat dissipation system may further include an outlet formed at the other side of the first and second heat dissipation plates and extended to the cooling medium flow passage, to discharge the cooling media.

According to another preferred embodiment of the present invention, there is provided a heat dissipation system for a power module including a plurality of inflow lines and supplying cooling media to a plurality of inflow lines at different flow rates or fluxes.

The heat dissipation system may further include: first and second heat dissipation plates spaced apart from each other while facing each other, to form a cooling medium flow passage; first and second inflow lines extended to the cooling medium flow passage of the first and second heat dissipation plates, to transfer cooling media flowing therein at different flow rates or different fluxes to the cooling medium flow passage; and first and second inlets respectively connected with the first and second inflow lines to allow the cooling media to flow therein.

The heat dissipation system may further include a plurality of heat dissipation fins formed on a cooling medium flow passage formation plane of the first and second heat dissipation plates.

The heat dissipation system may further include a partition member formed between the plurality of heat dissipation fins on the cooling medium flow passage formation plane of the first and second heat dissipation plates.

The heat dissipation system may further include a controller controlling fluxes or flow rates of the cooling media flowing into the first ands second inlets.

The heat dissipation system may further include an insulating layer formed on the first and second heat dissipation plates.

The heat dissipation system may further include semiconductor devices formed on the insulating layer.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
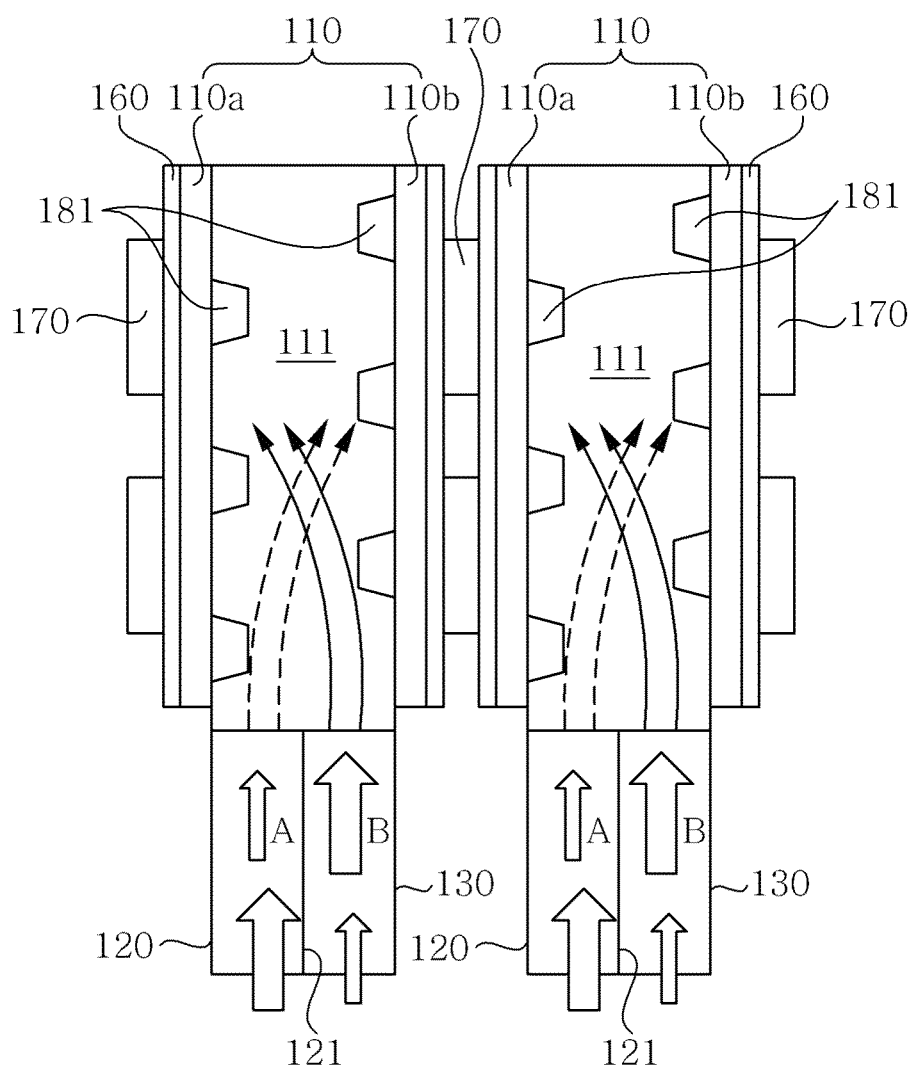
FIG. 1 is a cross-sectional view of a heat dissipation system for a power module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side", and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Heat Dissipation System for Power Module

FIG. 1 is a cross-sectional view of a heat dissipation system for a power module according to a preferred embodiment of the present invention; FIGS. 2A to 2H are exploded perspective views of the heat dissipation system for a power module according to the preferred embodiment of the present invention; and FIG. 3 is a view showing in detail the constitution of heat dissipation pins and partition members.

A heat dissipation system 100 for a power module according to a preferred embodiment of the present invention includes a plurality of inflow lines 120 and 130, and thus, may supply cooling media to the plurality of inflow lines 120 and 130 at different flow rates or different fluxes.

Here, the cooling medium may be in a gas or liquid type, and for example, may be air, cooling water, coolant, or the like.

As shown in FIG. 1, a heat dissipation system 100 for a power module may include: first and second heat dissipation plates 110, 110a and 110b (hereinafter, designated as 110) spaced apart from each other while facing each other to form a cooling medium flow passage 111; first and second inflow lines 120 and 130 extended to the cooling medium flow passage 111 of the first and second heat dissipation plates 110, to transfer cooling media flowing therein at different flow rates or different fluxes to the cooling medium flow passage 111; and first and second inlets (140 and 150 in FIG. 2) respectively connected with the first and second inflow lines 120 and 130 to allow the cooling media to flow therein.

In addition, the first and second inflow lines 120 and 130 may be extended to one side of the first and second heat dissipation plates 110.

As shown in FIG. 1, the first and second inflow lines 120 and 130 may be formed as separating flow passages, by forming a separating member 121 in one flow passage to separate the first and second inflow lines 120 and 130 from each other.

As shown in FIG. 1, in the heat dissipation system 100 for a power module, when the first and second heat dissipation plates 110 and the first and second inflow lines 120 and 130 are plural in number, respectively, the plurality of first and second heat dissipation plates 110 and first and second inflow lines 120 and 130 may be combined with each other in a stacking type.

Since a stacking type of the heat dissipation system 100 for a power module has a structure where the first and second heat dissipation plates 110 are formed based on semiconductor devices, double-sided cooling may be performed on the semiconductor device, thereby improving heat dissipation efficiency.

In addition, the plurality of first and second inflow lines 120 and 130 are all connected to the first and second inlets 140 and 150. Here, the first inflow line 120 and the second inflow line 130 may be separated from each other and connected to the first inlet 150 and the second inlet 140.

Referring to FIGS. 1 and 2A to 2H, a plurality of inflow lines 120 are connected to the first inlet 150, so that a cooling medium A flowing in through the first inlet 150 is distributed into a plurality of first inflow lines 120.

Meanwhile, a plurality of inflow lines 130 are connected to the second inlet 140, so that a cooling medium B flowing in through the second inlet 140 is distributed into a plurality of second inflow lines 130.

Referring to FIGS. 2A to 2H, the cooling media A and B flowing in through the first and second inlets 150 and 140 are distributed to respective layers of the heat dissipation system 100 for a power module. Here, the cooling media A and B in the first and second inflow lines 120 and 130 flow to the cooling medium flow passage 111 through opened regions as shown in FIGS. 2B, 2D, 2F, and 2H.

As shown in FIG. 3, the heat dissipation system 100 for a power module may include a plurality of heat dissipation pins 181 formed on a cooling medium flow passage formation plane of the first and second heat dissipation plates 110.

Here, the height of the heat dissipation pins 181 may be changed according to the needs of operators in consideration of heat dissipation efficiency.

In addition, the heat dissipation pins 181 are formed on the cooling medium flow passage formation plane of the first and second heat dissipation plates 110, to thereby more rapidly dissipate the heat generated from the cooling media and semiconductor devices 170.

In addition, the heat dissipation system 100 for a power module may include a partition member 183 formed between the plurality of heat dissipation pins 181 on the cooling medium flow passage formation plane of the first and second heat dissipation plates 110.

The partition member 183 allows the cooling media flowing into the cooling medium flow to passage 111 to equally be distributed, thereby preventing the cooling medium from being leaned to one side in advance.

In addition, the heat dissipation system 100 for a power module may further include a controller (not shown) controlling the flow rates or fluxes of the cooling media flowing into the first and second inlets 140 and 150.

In addition, the controller may control the flow rates or fluxes of the cooling media flowing into the first and second inlets 140 and 150 to be different from each other.

For example, the controller may periodically or non-periodically control the flow rates or fluxes of the cooling media flowing into the first and second inlets 140 and 150.

As shown in FIG. 1 and FIGS. 2A to 2H, when the flow rate or flux of the cooling medium A flowing into the first inlet 150 is increased, the cooling medium A flows into the cooling medium flow passage 111 while curving toward the second heat dissipation plate 110*b*, so that the cooling medium A is mixed with the cooling medium flowing in the cooling medium flow passage 111.

Meanwhile, when the flow rate or flux of the cooling medium B flowing into the second inlet 140 is increased, the cooling medium B flows into the cooling medium flow passage 111 while curving toward the first heat dissipation plate 110*a*, so that the cooling medium B is mixed with the cooling medium flowing in the cooling medium flow passage 111.

As described above, the controller controls the fluxes or flow rates of the cooling media flowing into the first and second inlets 150 and 140, to thereby mix the cooling media flowing in the cooling medium flow passage 111, so that the controller, in advance, prevents the temperatures of the cooling media from being increased.

In addition, the heat dissipation system 100 for a power module may further include an to insulating layer 160 formed on the first and second heat dissipation plates 110, and semiconductor devices 170 formed on the insulating layer 160.

Figure 2A:
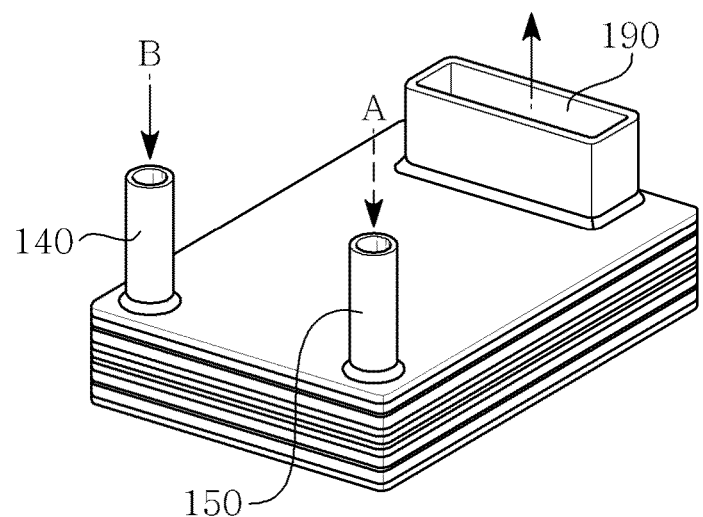
FIGS. 2A to 2H are exploded perspective views of the heat dissipation system for a power module according to the preferred embodiment of the present invention.
Figure 2B:
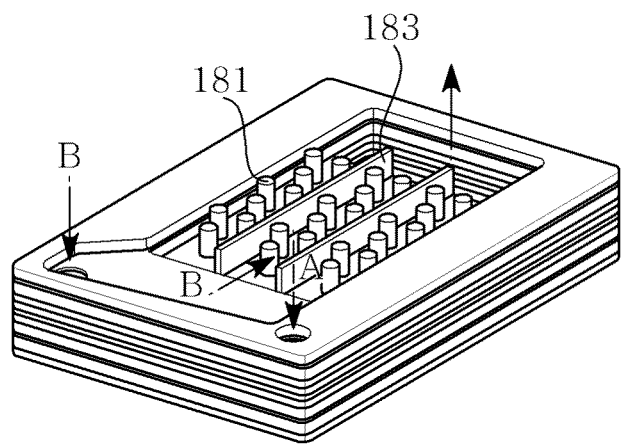
Figure 2C:
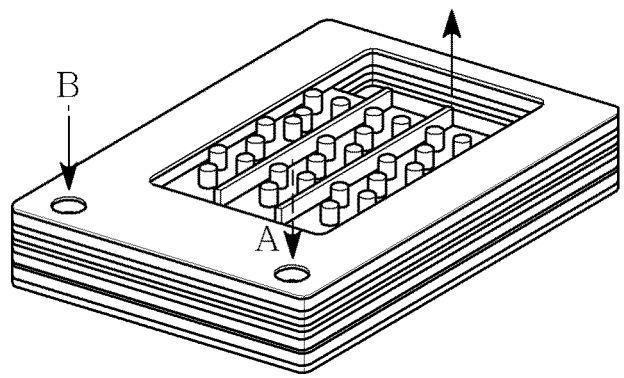
Figure 2D:
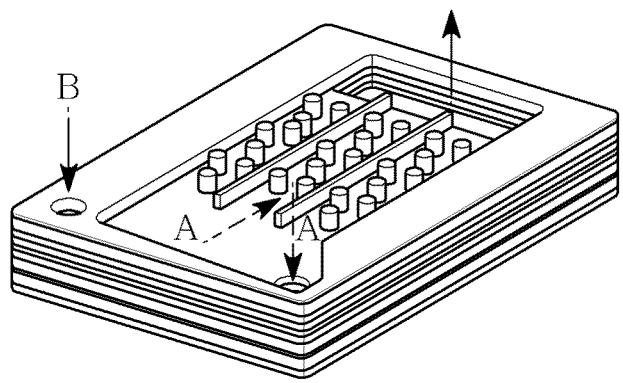
Figure 2E:
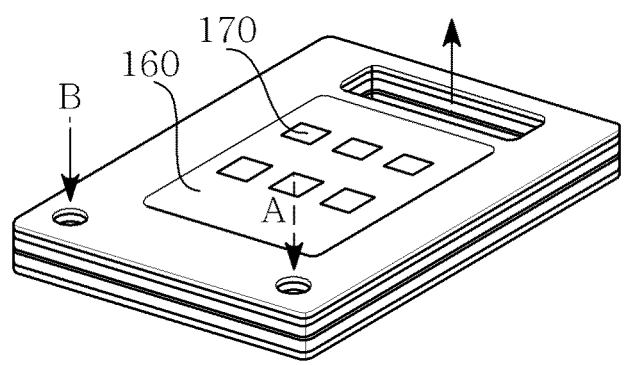
Figure 2F:
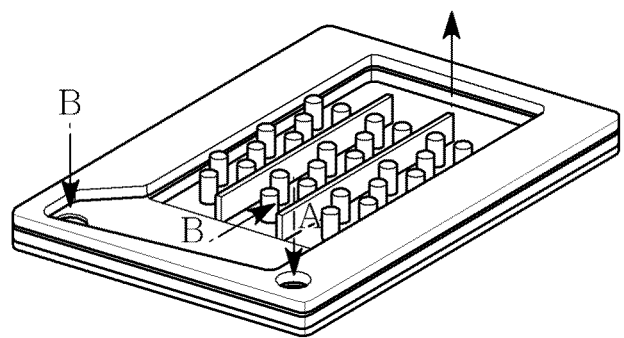
Figure 2G:
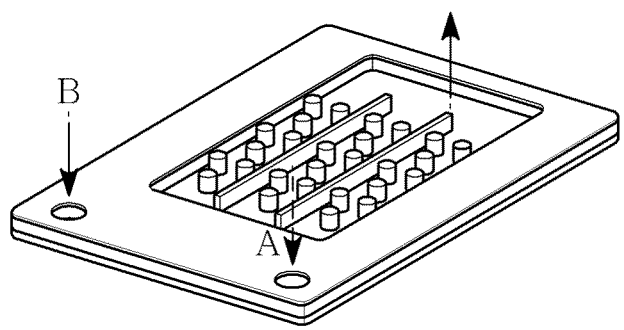
Figure 2H:
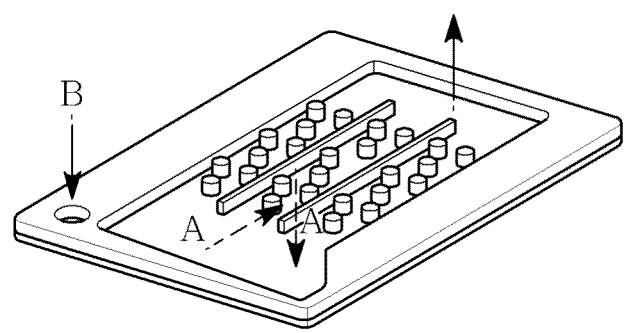
Figure 3:
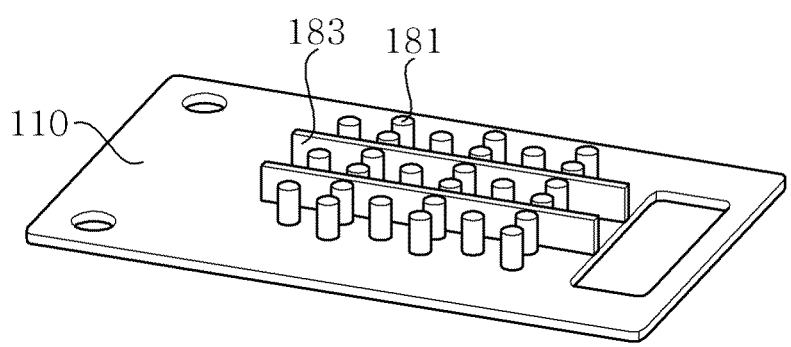
FIG. 3 is a view showing in detail the constitution of heat dissipation pins and partition members.

As shown in FIG. 2A, the heat dissipation system 100 for a power module may further include an outlet 190 formed at the other side of the first and second heat dissipation plates 110 and extended from the cooling medium flow passage 111, to thereby discharge the cooling media.

As set forth above, the heat dissipation system for a power module according to the preferred embodiment of the present invention controls the flow rates or fluxes of the cooling media supplied thereto to be different from each other by including a plurality of inflow lines, and thus, can prevent the rapid increase in temperature of the power module by mixing the cooling media, which can rapidly dissipate the heat generated from the power module.

Further, the heat dissipation system for a power module according to the preferred embodiment of the present invention has a structure where one inlet and one outlet are connected with the plurality of inflow lines, and thus, can facilitate manufacture of the heat dissipation system, including flow passage connection, and facilitate control of the cooling media.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A heat dissipation system for a power module, the heat dissipation system comprising:
    first and second heat dissipation plates spaced apart from each other while facing each other, to form a cooling medium flow passage;
    first and second inflow lines extended to the cooling medium flow passage of the first and second heat dissipation plates, to transfer cooling media flowing therein at different flow rates or different fluxes to the cooling medium flow passage; and
    first and second inlets respectively connected with the first and second inflow lines to allow the cooling media to flow therein.

2. The heat dissipation system as set forth in claim 1, wherein the first and second inflow lines are extended to one side of the first and second heat dissipation plates.

3. The heat dissipation system as set forth in claim 1, wherein, when the first and second heat dissipation plates and the first and second inflow lines are plural in number, the plurality of first and second heat dissipation plates and the first and second inflow lines are combined with each other in a stacking type.

4. The heat dissipation system as set forth in claim 3, wherein the plurality of first and second inflow lines are all connected to the first and second inlets, respectively, while the first and second inflow lines are separated from each other.

5. The heat dissipation system as set forth in claim 1, further comprising a plurality of heat dissipation fins formed on a cooling medium flow passage formation plane of the first and second heat dissipation plates.

6. The heat dissipation system as set forth in claim 5, further comprising a partition member formed between the plurality of heat dissipation fins on the cooling medium flow passage formation plane of the first and second heat dissipation plates.

7. The heat dissipation system as set forth in claim 1, further comprising a controller controlling fluxes or flow rates of the cooling media flowing into the first and second inlets.

8. The heat dissipation system as set forth in claim 7, wherein the controller controls the fluxes or flow rates of the cooling media flowing into the first and second inlets to be different from each other.

9. The heat dissipation system as set forth in claim 1, further comprising an insulating layer formed on the first and second heat dissipation plates.

10. The heat dissipation system as set forth in claim 9, further comprising semiconductor devices formed on the insulating layer.

11. The heat dissipation system as set forth in claim 1, further comprising an outlet formed at the other side of the first and second heat dissipation plates and extended to the cooling medium flow passage, to discharge the cooling media.

12. A heat dissipation system for a power module comprising a plurality of inflow lines and supplying cooling media to a plurality of inflow lines at different flow rates or fluxes.

13. The heat dissipation system as set forth in claim 12, further comprising:
    first and second heat dissipation plates spaced apart from each other while facing each other, to form a cooling medium flow passage;
    first and second inflow lines extended to the cooling medium flow passage of the first and second heat dissipation plates, to transfer cooling media flowing therein at different flow rates or different fluxes to the cooling medium flow passage; and
    first and second inlets respectively connected with the first and second inflow lines to allow the cooling media to flow therein.

14. The heat dissipation system as set forth in claim 13, further comprising a plurality of heat dissipation fins formed on a cooling medium flow passage formation plane of the first and second heat dissipation plates.

15. The heat dissipation system as set forth in claim 14, further comprising a partition member formed between the plurality of heat dissipation fins on the cooling medium flow passage formation plane of the first and second heat dissipation plates.

16. The heat dissipation system as set forth in claim 13, further comprising a controller controlling fluxes or flow rates of the cooling media flowing into the first ands second inlets.

17. The heat dissipation system as set forth in claim 13, further comprising an insulating layer formed on the first and second heat dissipation plates.

18. The heat dissipation system as set forth in claim 17, further comprising semiconductor devices formed on the insulating layer.

* * * * *